(12) United States Patent
Levinski et al.

(10) Patent No.: US 7,352,451 B2
(45) Date of Patent: Apr. 1, 2008

(54) SYSTEM METHOD AND STRUCTURE FOR DETERMINING FOCUS ACCURACY

(75) Inventors: Vladimir Levinski, Nazareth-Ilit (IL); Michael E. Adel, Ya'akov (IL)

(73) Assignee: KLA-Tencor Corporation, San Jose, CA (US)

( * ) Notice: Subject to any disclaimer, the term of this patent is extended or adjusted under 35 U.S.C. 154(b) by 431 days.

(21) Appl. No.: 11/032,126

(22) Filed: Jan. 11, 2005

(65) Prior Publication Data

US 2006/0103836 A1 May 18, 2006

Related U.S. Application Data

(60) Provisional application No. 60/626,869, filed on Nov. 12, 2004.

(51) Int. Cl.
*G01J 1/00* (2006.01)
*G01B 9/00* (2006.01)
(52) U.S. Cl. ........................ 356/123; 253/124
(58) Field of Classification Search ........... 356/123, 356/124
See application file for complete search history.

(56) References Cited

U.S. PATENT DOCUMENTS 6,061,606 A 5/2000 Ross ..................... 700/121
7,057,715 B2 * 6/2006 Robinson ................ 356/124
2002/0155356 A1 * 10/2002 Fujimoto ................. 430/5
2003/0026471 A1 2/2003 Adel et al. ............... 382/144

OTHER PUBLICATIONS

Ghinovker, et al., "Overlay Marks, Methods of Overlay Mark Design and Methods of Overlay Measurements", U.S. Appl. No. 09/894,987, filed on Jul. 27, 2001.
Adel, et al., "Overlay Metrology and Control Method", U.S. Appl. No. 10/367,124, filed on Feb. 13, 2003.
Claims form U.S. Appl. No. 10/950,172, filed on Sep. 23, 2004.

* cited by examiner

Primary Examiner—Gregory J. Toatley, Jr.
Assistant Examiner—Amanda H Merlino
(74) Attorney, Agent, or Firm—Beyer Weaver LLP (57) ABSTRACT

Within a lithography process having a critical dimension, a method, system and structure for determining a focus deviation value relative to an ideal focus position said is disclosed. By projecting a series of lines or spots characterized by the constant pitch size which is greater than the projection devise optical resolution and incrementally increasing widths onto the surface of the photoactive material, wherein the width of at least one of the lines or sports is substantially the same as the critical dimension, and the widths of the other lines or spots are substantially equally distributed around the critical dimension, approximate focus and exposure dose deviation values may be determined.

8 Claims, 5 Drawing Sheets

Mark Behavior (i.e. Number of Lines Formed On Photoresist) at Different Stepper Focus Positions Relative To Actual Plane Of Photoresist Surface FIG. 4A  −300 nm
FIG. 4B  −200 nm
FIG. 4C  −100 nm
FIG. 4D  0nm
FIG. 4E  100 nm
FIG. 4F  200 nm

SYSTEM METHOD AND STRUCTURE FOR DETERMINING FOCUS ACCURACY

CROSS-REFERENCE TO RELATED APPLICATIONS

The present application claims priority from U.S. provisional patent application Ser. No. 60/626,869, filed Nov. 12, 2004, which is hereby incorporated by reference in its entirety.

FIELD OF THE INVENTION

The present invention relates generally to producing process adjustably sensitive lithographic features on semiconductor wafers. More particularly, the present invention provides apparatus and methods using wavefront engineering to produce targets on semiconductor wafers which are sensitive to focus and dosage variations in equipment effectuating the printing of layers on wafers

BACKGROUND OF THE INVENTION

Designers and semiconductor device manufacturers constantly strive to develop smaller devices from wafers, recognizing that circuits with smaller features generally produce greater speeds and increased yield (numbers of usable chips produced from a standard semiconductor wafer). It is desirable to produce wafers with consistent dimensions, particularly as to the line widths printed on the devices. However, with smaller devices (where the critical dimension of the printed features are smaller than the exposure wavelength) the difficulty in meeting critical dimension tolerances increases. Certain wave front engineering techniques such as optical proximity correction (OPC) and phase shift mask (PSM) techniques are often applied to reticles to improve lithographic performance and extend the useful lifetime of optical exposure tools. The changes produced by these techniques are referred to as wavefront engineering features. Phase shift mask (PSM) techniques (strong-alternating, weak-embedded, and attenuating) are used mainly to improve lithographic resolution, improve depth of focus, and monitor the lithographic stepper or scanner performance using focus monitors. Optical proximity correction is a wavefront engineering technique wherein a modification of the photomask pattern (binary changes, i.e., adding or subtracting chrome on the mask) is made to compensate for changes in feature shape and size that occur during pattern transfer from the mask to the wafer. These feature changes may be caused by extra exposure due to the presence of adjacent lithographic features, a limitation in the wafer stepper/scanner, or a variation in the activity of a given wafer process step. OPC is also used on phase shifted masks to maximize the benefit gained from PSM technology. While OPC techniques are often used to correct for pattern fidelity error (a reduction in the quality of the aerial image) and improve process latitudes, OPC does little for improving resolution. In addition to OPC and PSM technologies, a variety of other wavefront engineering techniques are currently in use. For example, sub-resolution features called "scatter bars" (binary mask additions or sub-resolution mask patterns which do not print) improve lithographic behavior of small isolated and quasi-dense features by adjusting the shape of the aerial image—simply an extension of OPC technology.

Minor variations in process parameters, such as changes in focus and exposure dose on photolithographic exposure equipment (scanners/steppers), may cause the critical dimensions (CD) on the wafers to fall outside acceptable semiconductor manufacturing tolerances (typical CD specifications are +/−8%). A large number of process parameters may affect the dimensions of a resist pattern on a silicon wafer. Some of the most significant parameters include: resist thickness, focus position, exposure dose, resist pre and post bake temperatures and development temperature and time. While photolithographic exposure tools and photolithographic resist tracks continuously monitor and adjust for small fluctuating changes in the process conditions (bake times, exposure dose, focus, etc.,) the resulting resist feature size or critical dimension is a complex result of all process variables. Typically, semiconductor manufacturing facilities correct for process variation (drifting CD's) by adjusting only the exposure dose (e.g. hourly changes). This tends to provide the most economically viable solution.

Figure 1:
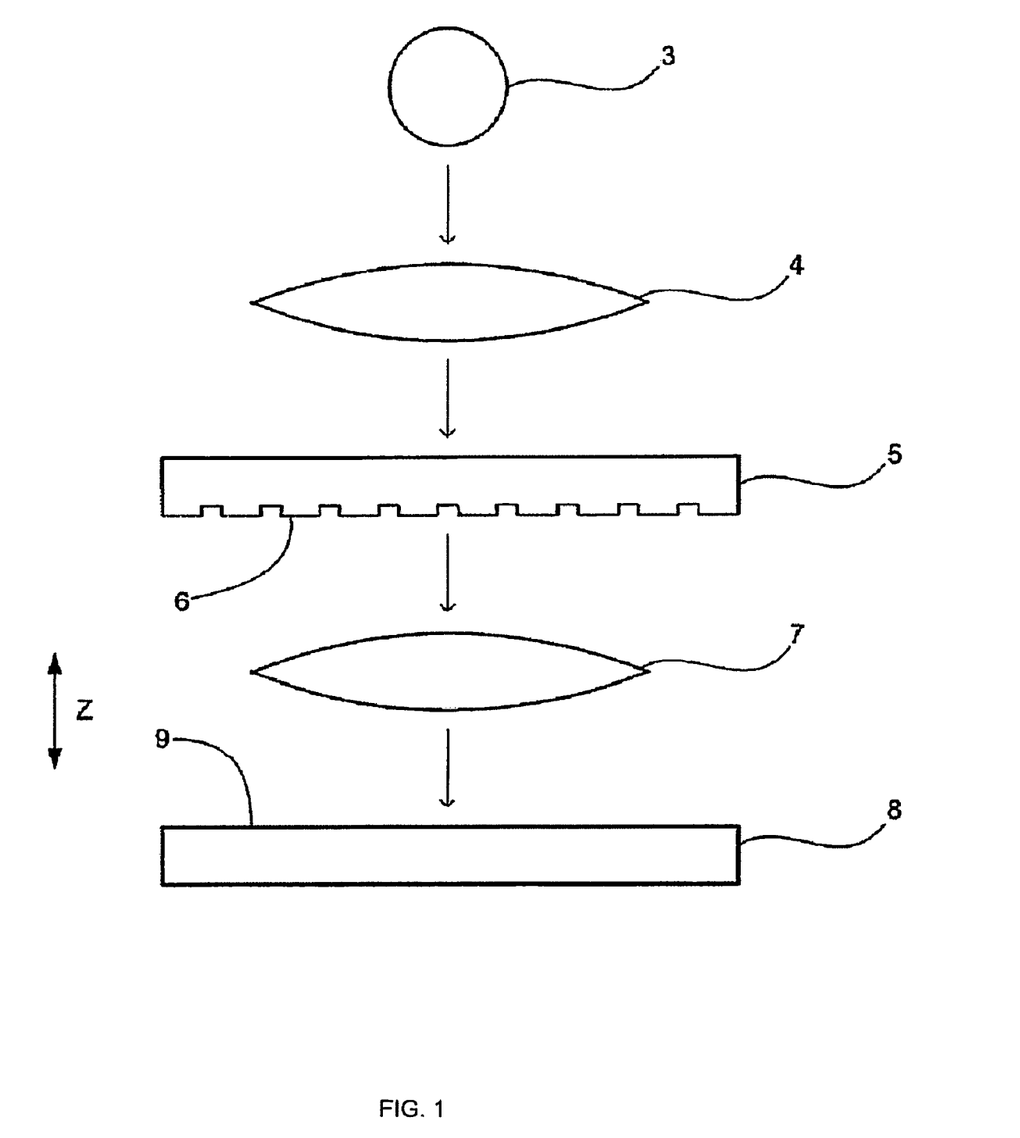
FIG. 1 is a block diagram illustration of is a lithography system which may be used in accordance with some embodiments of the present invention.

Photolithography is one of the most important steps of the semiconductor manufacturing process. Most integrated circuits are made using a photolithographic processes, which process uses photolithographic masks and an associated light or radiation source to project a circuit image onto a wafer. Referring to FIG. 1, for example, a simplified diagram of a lithography system 2 is shown. By way of example, the lithography system may correspond to a stepper or scanning system. The lithography system I typically includes a light or radiation source 3 and a first set of optics 4 that illuminate a mask 5 having a circuit pattern 6 disposed thereon. In order to form the circuit pattern, the mask 6 may include opaque portions and/or transmissive portions. As is generally well known, the opaque portions block the light from passing through the mask 6 while the transmissive portions allow the light to pass therethrough. In some cases, the transmissive portions may constitute phase shifted areas. Phase shifted areas tend to alter the phase of the light or radiation passing through the mask. The lithography system 2 also includes a second set of optics 7 that pick up the transmitted light or radiation and focuses (or images) it onto a surface 9 of a semiconductor wafer 8 thus writing the pattern of the mask 6 onto the surface 9 of the semiconductor wafer 8. In most cases, the semiconductor wafer 8 includes a layer of photoresist that when exposed to the patterned light or radiation forms the pattern of the mask onto the wafer.

During most photolithographic processes, such as the one depicted in FIG. 1, a semiconductor wafer is coated with a light sensitive material called a photoresist or resist (example; chemically amplified resist (CAR)) and is exposed with an actinic light source (excimer laser, mercury lamp, etc.,). The exposure light passes through a photomask and is imaged via projection optics onto the resist coated wafer forming a reduced image (typically 4× or 5×) of the photomask in the photoresist. For positive chemically amplified resists (CARs), the actinic light source typically causes the production of photoacids that diffuse during post exposure bake and allow the resist to be rinsed away by an aqueous developer only in those regions receiving most of the exposure dose.

A final step in the photolithographic process may involve etching the resist-coated wafers using complex plasma chemistry to attack the semiconductor material not covered with photoresist, and following etch, the resist coated wafers are cleaned and sent to a scanning electron microscope or other metrology for final lithographic inspection. Since prior to etching, it is possible to repeat the lithographic processing if a problem is detected in time, and after the photoresist wafers are physically etched it is too late to correct a problem with the photolithographic imaging process, precise control of the printing process is desired to ensure that the device line widths forming the pattern on the wafer fall within tolerance. Thus, following the develop process the resist patterned wafers may be sent to a metrology station to measure the critical dimensions or shape of the patterned resist features. Typical metrology tools include scatterometers, scanning electron microscopes and atomic force microscopes.

One problem that has been encountered during lithographic processes, and which needs monitoring, is the misfocus found between the actual focus plane of the optical system used for the process and the ideal focus plane, where the best or "ideal" focus position for target printing is usually within the resist layer. For example, referring back to FIG. 1, the light or radiation follows an optical path that corresponds to the Z axis. The first and second set of optics as well as the mask and the wafer are thus positioned orthogonal to the optical path in different X&Y planes. With this in mind, the second set of optics generally focuses the light on a specific X&Y plane (not shown) positioned along the Z axis. This plane is generally referred to as the ideal focus plane. When the system is out of focus, the stepper focus plane may be offset relative to the ideal focus position. As should be appreciated, misfocus generally has a sign and magnitude corresponding to the Z axis displacement. The sign corresponds to the direction of the displacement (e.g., positive or negative), and the magnitude corresponds to the amount of displacement (e.g., the actual distance between planes). The displacement may be caused by many factors. For example, the second set of optics and/or the wafer may be mis-aligned (e.g., tilted) or they may be positioned in the wrong plane along the Z axis. Deviations on the surface of the wafer itself may contribute to misfocus.

As mentioned above, misfocus may adversely affect the printed pattern on the wafer. For example, misfocus may cause increases or decreases in the width of the lines printed on the wafer, (i.e., linewidth is a function of focus). The linewidth generally determines the speed and the timing across the circuit and thus misfocus may cause one portion of the chip to run faster or slower than another portion of the chip. In most cases, the chip is clocked to the slowest portion thereby reducing chip performance and most often the selling price of the chip. In addition, misfocus may cause open or shorted circuits such that the chip must be discarded or reworked.

Under certain circumstances, when the magnitude of the misfocus is sufficiently great, the intensity of exposure (Iexposure) experienced by some or all of the photo resist, which is meant to be exposed, may not exceed an intensity threshold value (Ithreshold), which intensity threshold value (Ithreshold) may be required to make the photo resist soluble. For example, if the misfocus results in the focal plain of the projected pattern being considerably above the actual surface of the photo resist layer, the surface of the photo resist may experience exposure with an intensity level above the threshold intensity, but due to optical divergence of the beam, portions of the photo resist below the surface may not experience sufficient exposure intensity and may not dissolve. If the misfocus results in the focal plain being considerably below the photo resist layer, the intensity of the beam at the surface of the photo resist may not be sufficiently converged, focused or dense to have an intensity which exceeds the require threshold value, and the surface of the photo resist may not experience sufficient exposure to make it soluble using an subsequent aqueous developer.

Presently, focus is determined by exposing a pattern through a range of focus settings, and then inspecting the resultant patterns for the best looking images or by using an aerial image monitor to determine the spatial location of the best focus.

Presently, one monitoring technique used is a lot sampling of the resist imaged wafers to determine if the line widths (critical dimensions) have fallen outside an acceptable range prior to etch. However, given the extremely small sizes of the devices, for example device sizes of 0.15 micron or smaller, expensive and slow metrology techniques are necessary. With these dimensions, one of the few effective tools currently in use to measure line widths is a scanning electron microscope (SEM). The wafers must be removed from their processing location and transported to the SEM. Moreover, the time required for SEM inspections is so extensive that a typical sampling rate may not detect a process drift until after a large number of wafers have been etched.

Other monitoring metrologies include; scatterometry techniques (ellipsometry, variable angle, reflection) using complex and expensive look-up libraries, and optical CD techniques utilizing an inexpensive optical metrology tool and dual toned line shortening ("schnitzl") arrays to indirectly measure the critical dimensions of photoresist patterned wafers using line-end shortening techniques. While the OCD technique is fast and inexpensive, the technique may or may not have the optimum process sensitivity that is required for day to day production monitoring routines. In practice, the OCD technique can be used to determine both focus and exposure drifts by building a second order polynominal description of the complex CD drift with changes in focus and exposure. However, the ability to determine absolute direction of focus drifts requires the additional printing of test fields out of focus—which takes valuable exposure time and space on a semiconductor wafer.

SUMMARY OF THE INVENTION

In accordance with some embodiments of the present invention, a masking structure or mark may be used to estimate the focus quality of a photolithographic pattern or a photolithographic system. Within a lithography process having a critical dimension, a method of estimating a focus deviation value may include projecting a series of lines or spots characterized by incrementally increasing widths onto the surface of the photoactive material, wherein the width of at least one of the lines or sports is substantially the same as the critical dimension and the widths of the other lines or spots are substantially equally distributed around the critical dimension. A distance between the subsequence of lines or spots may be larger than the projection devise optic resolution, so that the printed lines or spots can be considered as isolated features in sufficient range of focus position around the best focus position. Once the lines have been projected on to the surface for a predefined exposure period and using predefined illumination source intensity, by determining what number of lines or spots projected onto the photoactive material resulted in photochemical reactions on the photoactive material, an estimation of the focus deviation value may be made.

In accordance with embodiments of the present invention, a focus masking structure or mark used for a lithography process having a critical dimension may include a series of line or spot shaped apertures characterized by incrementally increasing widths, wherein the width of at least one of the lines or sports is substantially the same as the critical dimension and the widths of the other lines or spots are substantially equally distributed around the critical dimension may be produced on.

BRIEF DESCRIPTION OF THE DRAWINGS

Aspects of the present invention may best be understood by reference to the following detailed description when read with the accompanying drawings, in which.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, and components have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

In accordance with some embodiments of the present invention, a masking structure or mark may be used to estimate the focus quality of a photolithographic pattern or a photolithographic system. Within a lithography process having a critical dimension, a method of estimating a focus deviation value relative to the best or "ideal" focus position may include projecting a series of lines or spots characterized by incrementally increasing widths onto the surface of the photoactive material, wherein the width of at least one of the lines or sports is substantially the same as the critical dimension and the widths of the other lines or spots are substantially equally distributed around the critical dimension. Once the lines have been projected on to the surface for a predefined exposure period and using predefined illumination source intensity, by determining what number of lines or spots projected onto the photoactive material resulted in photochemical reactions on the photoactive material, an estimation of the focus deviation value may be made. More elaborate algorithms based on the analysis of the printed targets provide improved resolution in determining the deviation of the focus deviation value. Any such algorithm may be applicable to the present invention.

In accordance with embodiments of the present invention, a focus masking structure or mark used for a lithography process having a critical dimension may include a series of line or spot shaped apertures characterized by incrementally increasing widths, wherein the width of at least one of the lines or sports is substantially the same as the critical dimension and the widths of the other lines or spots are substantially equally distributed around the critical dimension may be produced on.

Figure 2:
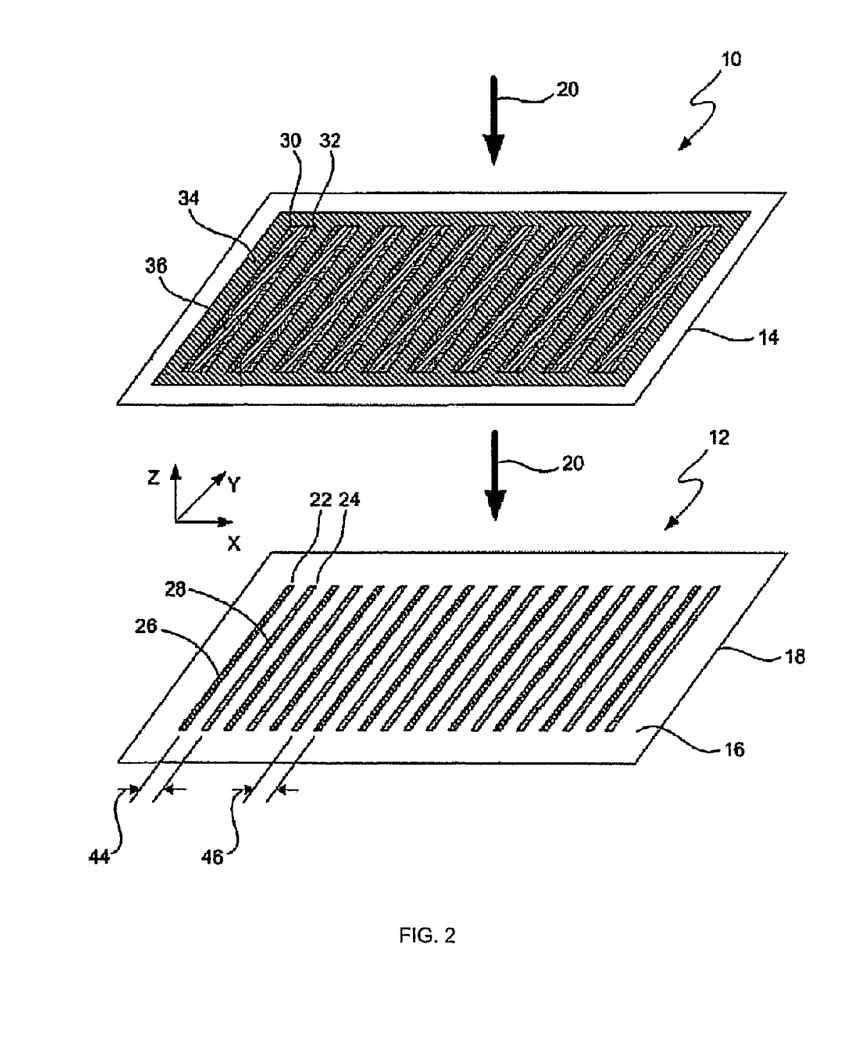
FIG. 2 is a is a simplified perspective view of a focus masking structure (i.e. mark) and a focus pattern, in accordance with some embodiment of the present invention.

FIG. 2 is a simplified perspective view of a focus masking structure 10, in accordance with some embodiments of the present invention. The focus masking structure 10 may be generally provided to produce a focus pattern 12 corresponding to the focus quality of a photolithographic pattern or a photolithographic system. The focus pattern 12 may be used to improve the focus control of subsequent lithographic patterning and to determine whether the quality of the photolithographic pattern meets specified requirements. The focus masking structure 10 may be suitable for a wide variety of photolithography processes, as for example, photolithographic processes pertaining to semiconductor manufacturing, optical device manufacturing, micro-mechanical device manufacturing, magnetic recording data storage manufacturing and the like.

Although not shown, one or more of the focus masking structures 10 may be positioned on a photolithographic mask. According to some embodiments, the focus masking structure may be positioned on a product mask configured for producing a circuit pattern on a wafer. In this embodiment, the focus masking structure may be generally positioned in a region of the product mask that is not used by a circuit pattern. For example, the focus masking structure may be positioned in a region that corresponds to the area of the wafer used for sawing (e.g., saw street). Any number of focus masking structures may be positioned on a product mask.

In general, the focus masking structure 10, which is located on a substrate 14, may be used to project a focus pattern 12 onto a surface 16 of a workpiece 18. In most cases, the focus pattern 12 is printed on the surface 16 of the workpiece 18 when light or radiation 20 is made to travel through the focus masking structure 10. By way of example, the surface 16 may include a layer of photoresist for capturing the image produced by the focus masking structure 10 when light 20 is passed therethrough. That is, the light or radiation may induce chemical and physical changes in the photoresist that can be developed into a structural pattern.

The focus masking structure 10 may be generally configured to produce a focus pattern 12 that changes with changes in focus. In general, the focus masking structure 10 may transform actual focus information in the Z-direction into measurable focus information in a direction orthogonal to the Z-axis, as for example, in the X and/or Y directions. For example, the measurable focus information may be contained in the focus pattern 12, which is positioned in an X & Y plane. According to some embodiments of the present invention, the working part of the mark may include the range between fully printed lines or spots and non-printed features. Since the position of this range is also exposure dose dependent, the whole mark may be used for concurrent focus and dose deviations measurement. For example, a shift of the working part of the mark in X/Y directions within the mark may be read as a measure of exposure dose deviations.

According to further embodiments of the present invention, the mark may be used to estimate focus deviation in conjunction with an optical system having relatively low resolution power and large pixel size. In this case, instead of lines or spots with incrementally increasing widths being used, sub series with the same feature sizes may be used so that the summarized width of each sub series is equal to the pixel size on the optical system. In this way, the amplitude of the detected signal in each pixel will correspond to the averaged over the pitch size amplitude obtained by an optical devise having high resolution power. According to the above described embodiment, the slope of the signal above the working part of the target may give a coarse estimation of focus deviation.

Figure 3A:
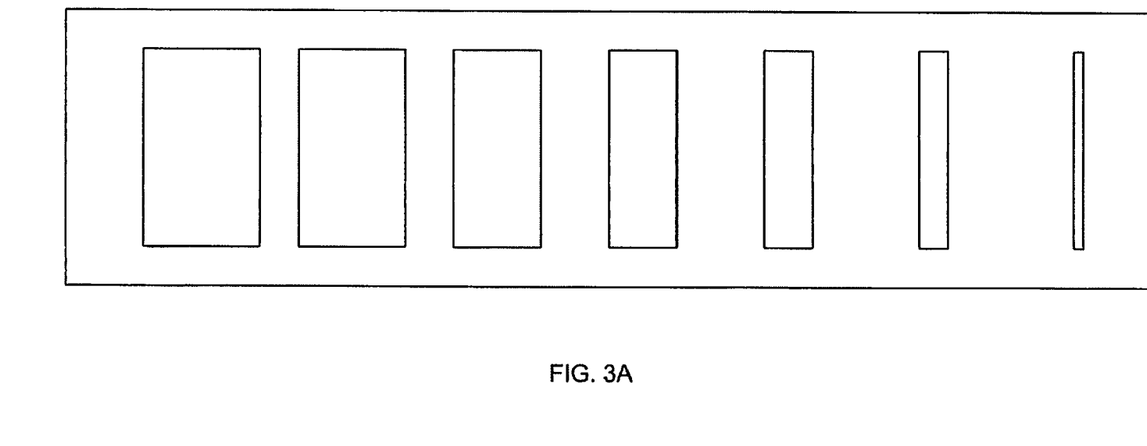
FIG. 3A is a top view of a focus masking structure according some embodiments of the present invention.
Figure 3B:
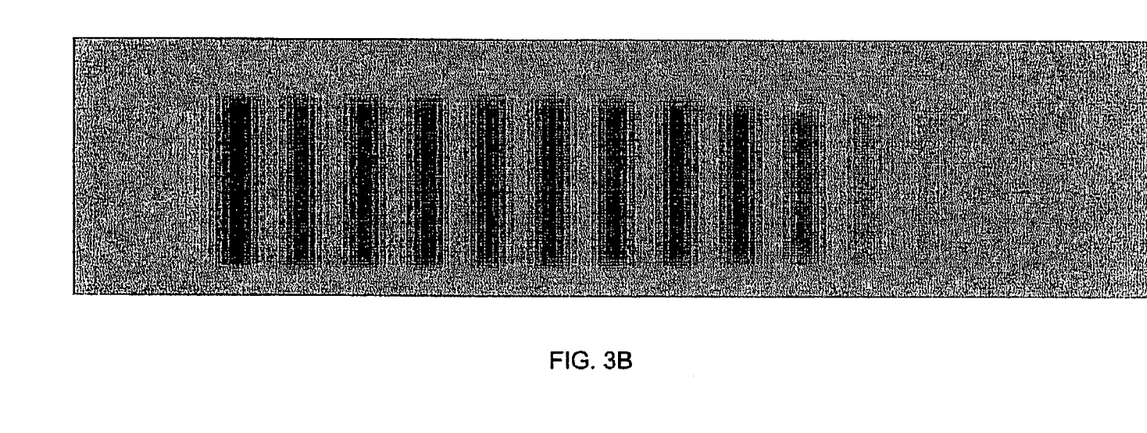
FIG. 3B is a top view of a line pattern produced on a photoresist surface which may result from processing a substrate with a lithography system according to FIG. 1 and using the focus masking structure of FIG. 3A, in accordance with some embodiments of the present invention.
Figure 4A:
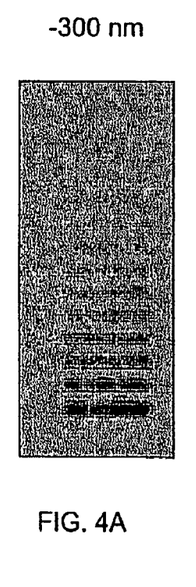
FIGS. 4A through 4F are a series images depicting the line number and thickness forming on a photoresist as a result of processing a substrate with a lithography system according to FIG. 1 and using the focus masking structure of FIG. 3A, at different stepper focus positions relative to actual plane of photoresist surface.
Figure 4B:
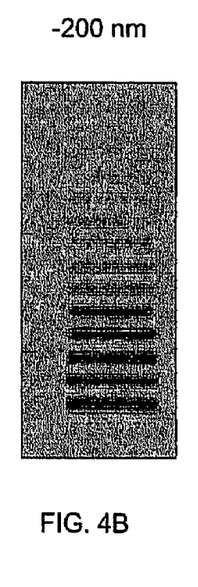
Figure 4C:
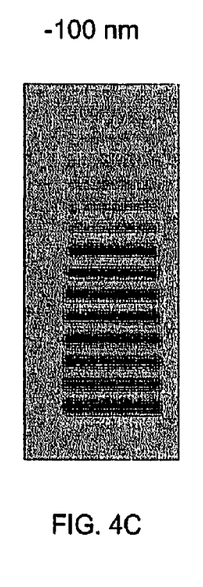
Figure 4D:
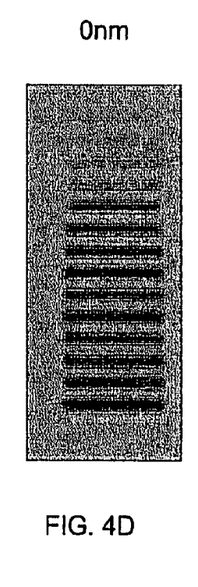
Figure 4E:
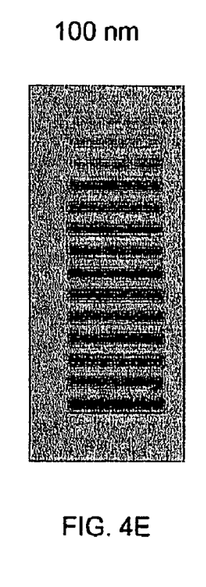
Figure 4F:
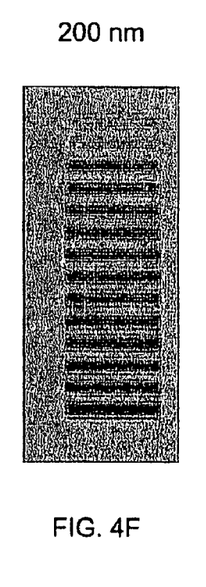

Turning now to FIGS. 3A and 3B, there is shown is a top view of a focus masking structure according some embodiments of the present invention, and a top view of a line pattern produced on a photoresist surface which may result from processing a substrate with a lithography system according to FIG. 1 and using the focus masking structure of FIG. 3A, in accordance with some embodiments of the present invention. The darkness of the lines on the photoresist layer in FIG. 3B indicates an extent of etching achieved based on the focus and exposure dosage of a given lithography process. Turing now to FIG. 4, each mark presented in FIG. 4 corresponds to a different stepper focus position with steps of 100 nm around the best focus position and the same exposure value. Qualitative estimations may provide at least 2 pitch size movements of the bounds between the well visible and less visible trenches at each 100 nm step in stepper focus position. A large sensitivity of a given mark makes possible a broad spectrum of algorithms, which can be applied for stepper focus position measurement. A first step is naturally to study the signals obtained by image projecting along the length of the trenches (horizontal direction in FIG. 4).

Figure 5A:
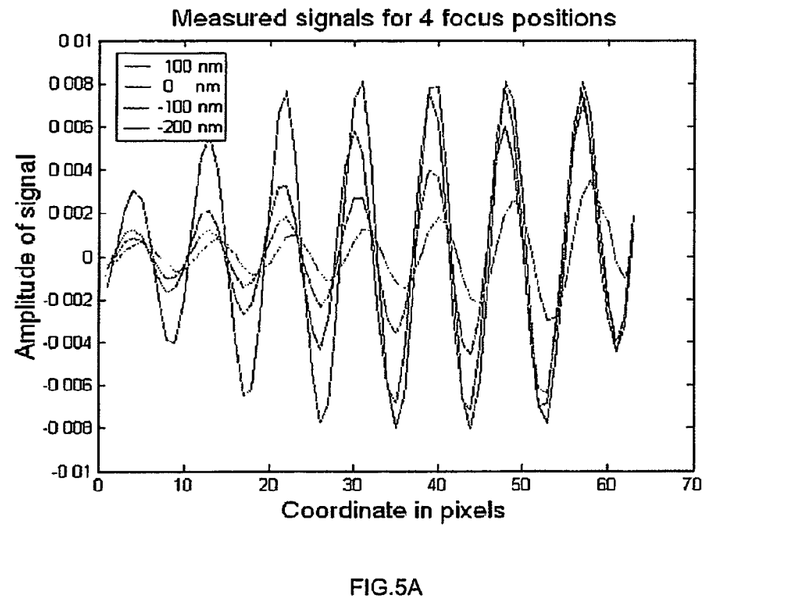
FIG. 5A is a graph showing a set of signal amplitudes corresponding to a scanning of the trenches of the marks in FIG. 4 at a number of different stepper focus positions.
Figure 5B:
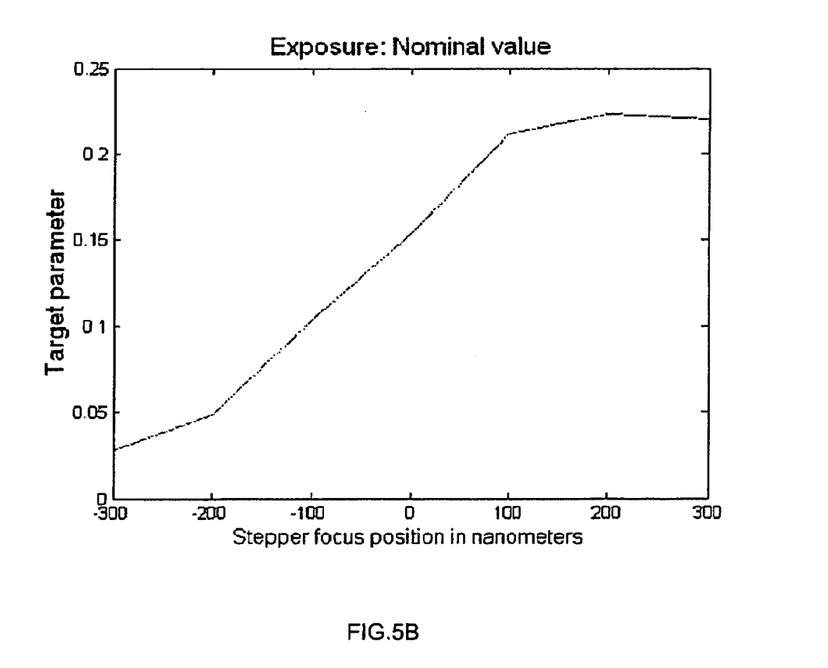
FIG. 5B is a graph of a target parameter's behavior as a function of the stepper focus position, according to some embodiments of the present invention.

A set of signal amplitudes corresponding to the output of a scanning process of the trenches of the marks in FIG. 4, either by laser scanning or image sensor acquired image analysis, at a number of different stepper focus positions is shown in FIG. 5A. Direct analysis methods, such as the threshold method, may be used to establish the position of the bounds between the well visible and less visible trenches or to introduce any circumstantial parameter characterizing of the mark as a whole (for example by calculating as the averaged amplitude of Fourier harmonic). As it is shown in FIG. 5B, in the approximately 300 nm range around the best focus position there is may be asymmetric behavior of target parameter which achieves approximately constant values (different from both sides) out of the range. Fitting the target parameter curve within the sensitive range with a line and using this line as a model, one can estimate the focus position of a stepper with an accuracy of about 10 nm.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed:

1. A method of estimating a focus deviation value of a lithographic process, comprising:
    providing a focus masking structure comprising a plurality of lines or spots having incrementally increasing widths, wherein the width of at least one of the lines or spots is substantially the same as a critical dimension of the lithographic process and the widths of the other lines or spots are substantially equally distributed around the critical dimension, wherein the focus masking structure is configured to produce a focus pattern that changes with the focus of the lithography process;
    using the focus masking structure in a lithographic process having a first focus value so as to produce a first focus pattern in a photoreactive material; and
    analyzing the first focus pattern to determine how much the first focus value deviates from an ideal focus value.

2. The method according to claim 1, further comprising determining a position of one or more regions between fully printed and non-fully printed lines or spots on the first focus pattern, wherein such determined position is analyzed to determine how much the first focus value deviates from the ideal focus value.

3. The method according to claim 2, further comprising measuring a signal average amplitude over one or more pitch sizes to perform a fast estimation of how much the first focus value deviates from the ideal focus value.

4. The method according to claim 3, wherein the pitch size is greater than a resolution power of projection optics used as part of the lithography process.

5. A lithography system having a critical dimension, said system comprising;
   an illumination source adapted to project energy through a focus masking structure onto a photoactive surface to form a focus pattern;
   an image sensor for detecting an image of the focus pattern; and
   a computing unit configured to perform the following operations:
      using a focus masking structure in a lithographic process having a first focus value so as to project energy from the illumination source through the focus masking structure to thereby produce a first focus pattern in a photoreactive material, wherein the focus masking structure comprises a plurality of lines or spots having incrementally increasing widths, wherein the width of at least one of the lines or spots is substantially the same as the critical dimension and the widths of the other lines or spots are substantially equally distributed around the critical dimension, wherein the focus masking structure is configured to produce a focus pattern that changes with the focus of the lithography process; and
      using the image sensor to analyze an image of the first focus pattern to determine how much the first focus value deviates from an ideal focus value.

6. The system according to claim 5, wherein said computing unit is further adapted to determine a position of one or more regions between fully printed and non-fully printed lines or spots on the first focus pattern, wherein such determined position is analyzed to determine how much the first focus value deviates from the ideal focus value.

7. The system according to claim 6, wherein said computing unit is further adapted to use the image sensor to measure a signal average amplitude over one or more pitch sizes to perform a fast estimation of how much the first focus value deviates from the ideal focus value.

8. The system according to claim 7, wherein the pitch size is greater than a resolution power of projection optics used as part of the lithography process.

* * * * *